United States Patent [19]

Robson et al.

[11] Patent Number: 4,569,583
[45] Date of Patent: Feb. 11, 1986

[54] ELECTROSTATIC CHARGE PROBE FOR ELECTROPHOTOGRAPHIC APPARATUS

[75] Inventors: Thomas Robson; Aubrey E. Thompson, both of Orlando, Fla.

[73] Assignee: Burroughs Corporation, Detroit, Mich.

[21] Appl. No.: 620,643

[22] Filed: Jun. 14, 1984

[51] Int. Cl.⁴ .................................... G03G 15/00
[52] U.S. Cl. .................... 355/14 CH; 355/3 CH; 355/14 R; 324/458
[58] Field of Search ............ 355/14 CH, 3 CH, 14 R, 355/3 R; 324/72, 457, 458

[56] References Cited

U.S. PATENT DOCUMENTS 3,944,354  3/1976  Benwood et al. ............... 355/14 R
4,261,660  4/1981  Suzuki et al. .................. 355/14 R Primary Examiner—R. L. Moses
Attorney, Agent, or Firm—Carl Fissell, Jr.; Kevin R. Peterson; Edmund M. Chung

[57] ABSTRACT

Novel apparatus (probe) for sensing and controlling the surface charge on an electro-photographic copier drum in which a hollow, cylindrical, tubular shield member provided with a single elongated aperture therein houses a rotatable charge receiving, insulatingly segmented, rod-like fluted member, the latter extending centrally through the shield member. The elongated slot of the outer shield member extends from edge-to-edge of the drum and in close, spaced proximity thereto. One end of the probe apparatus carries an electromagnetic, Hall effect transducer including a phasing paddle wheel member rotatable with the segmented member for timing and synchronizing the rotation of the probe with the drum rotation. The probe is disposed between two spaced apart drum charging corotrons. The probe senses the surface charge on the drum and compares this charge with a known standard charge level. An output potential level derived from this comparison is incremented or decremented in accordance with the comparison level and the derived charge is automatically applied to the drum surface via the charging corotrons.

10 Claims, 12 Drawing Figures

FIG.4.
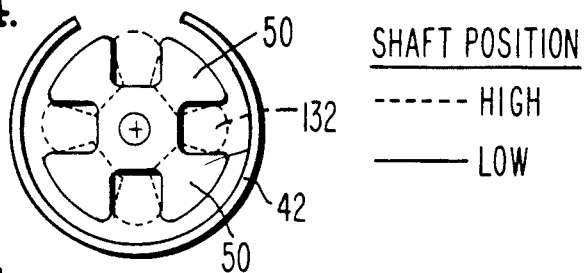
SHAFT POSITION
------ HIGH
——— LOW
FIG.5.
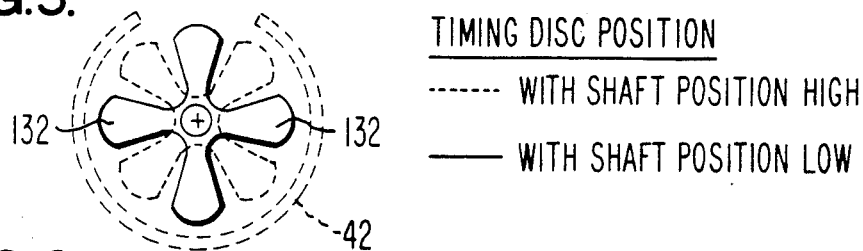
TIMING DISC POSITION
------ WITH SHAFT POSITION HIGH
——— WITH SHAFT POSITION LOW
FIG.6.
POS. ONE.
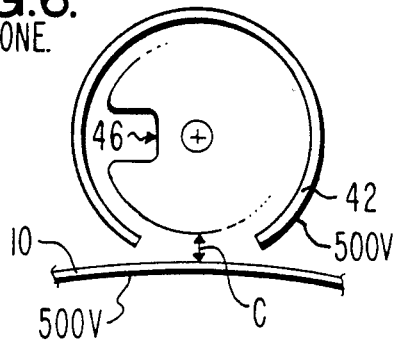
FIG.7.
POS. TWO.
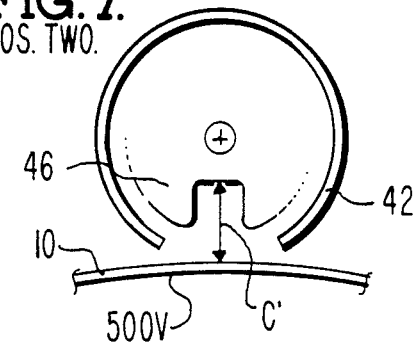
FIG.8.
[EQUATION 1]
Q — INDUCE A CHARGE ON ROTOR.
V — VOLTAGE DIFFERENCE BETWEEN ROTOR AND DRUM.
$$Q = CV$$
$$Q = C'V$$
$$\Delta Q = (C' - C)V \qquad \Delta t$$
$$\frac{\Delta Q}{\Delta t} = \frac{C' - C}{\Delta t} V$$
$$I = \frac{C' - C}{\Delta t} V$$
$$I \propto V$$
5pF (DIFF BKT.)
C' + C

ELECTROSTATIC CHARGE PROBE FOR ELECTROPHOTOGRAPHIC APPARATUS

CROSS REFERENCE TO RELATED APPLICATIONS

This application is related to and is considered to be an improvement over U.S. Ser. No. 513,560, filed 7/14/83, in the names of Thomas Robson and Aubrey E. Thompson, entitled "Electrophotographic Drum Surface Charge Control Apparatus and Method"; and assigned to the same assignee as the present invention.

BACKGROUND OF THE INVENTION

1. Field of the Invention

The present invention relates to electrophotographic apparatus and more specifically to apparatus for sensing and controlling the surface charge on an electrostatic printing/copying device.

2. Description of the Prior Art

Copying apparatus utilizing an electrophotographic drum for reproduction have, in the past, employed sophisticated switching devices to control the charging and discharging of the drum surface. Gas lasers used in such configuration utilize relatively expensive optical switching modulators for this purpose. As the speed requirement increases, such apparatus becomes non-cost effective as a result of the high cost of the controls required.

In contrast to this, the solid state infrared laser diode is relatively inexpensive, small in size and readily, rapidly switched on and off without the necessity for costly and sophisticated optical control assemblies.

Infrared sensitive surfaced members have a relatively rapid charge decay cycle, and thus, it is essential that the desired charge placed on the copy surface be and remain fixed at the required potential level for proper density, line resolution and readability of copy.

Prior art apparatus employ, among other things, photo-optical copy density feedback monitoring and measuring systems; vibrating reed electrostatic sensors driven by the coil of an electromagnet, etc. None of these perform completely efficiently or satisfactorily in the contaminated atmosphere of the toner station.

In addition, although many electrostatic charge sensing and measuring techniques are known, none are completely adaptable for the present purposes. For example, U.S. Pat. No. 3,525,936 to R. E. Vosteen describes and illustrates an electrostatic voltmeter wherein a detector preamplifier probe includes a rotatable perforated chopper disc the apertures of which are aligned with a single relatively small opening adjacent to the surface to be monitored. The probe also includes a magnetic reference pickup and an electrostatic detector which "looks" through the apertures to the surface being measured.

U.S. Pat. No. 2,980,855 to C. B. Moore relates to a coulometer used for measuring electrostatic charge on moving nonconductors such as yarn-thread. The patent describes a chopper (e.g., a vertically rotatable member) interposed between a sensing and a reference electrode provided with windows one of a pair of which cyclically exposes the sensing electrode to view of the reference electrode and the other of which simultaneously exposes the sensing electrode solely to the object under evaluation.

U.S. Pat. No. 3,812,419 to H. M. Kaunzinger et al relates to an electronic field mill wherein a probe is positioned beneath an electronic aperture having orthogonally arranged grid electrodes which are attached to an enclosure that is mounted within but separated or insulated from the edge of a shell of a reference surface.

U.S. Pat. No. 4,149,119 to R. F. Buchheit relates to an electrostatic voltmeter wherein a sensing probe is insulatingly mounted within a conductive housing. A rotating vane or shutter is located in front of a window in the housing with the housing in spaced relationship with a test surface. A photo-cell LED is used to sense the frequency of angular rotation of the shutter.

U.S. Pat. No. 4,205,267 to B. T. Williams relates to a non-contacting voltage follower which comprises a probe including a housing containing two electrodes adjacent to an opening in the probe to expose the two electrodes to the field to be measured and means for vibrating the electrodes relative to the opening to vary the compacitive coupling as a function of the rate or vibration.

U.S. Pat. No. 4,267,511 to K. Suzuki et al relates to a surface potential measuring device in which a measuring electrode is disposed adjacent to a surface to be measured. A rotatable chopper carrying a magnet rotates between a Hall effect device and a measuring electrode. The Hall effect device puts out a signal by being subjected to the field action from the magnet each time the chopper passes through the space between the surface to be measured and the measuring electrode.

It is noted that while each of these apparatus provide means for electrostatic field measurement no one or more show or describe the novel arrangement called for by the claims of the present application.

U.S. Pat. Nos. 3,525,936, 4,167,511 and 4,149,119 deal with rotating discs operable in a vertical plane as disclosed. U.S. Pat. No. 4,205,267 deals with vibrating vanes likewise in a vertical mode. U.S. Pat. No. 2,980,855 shows a vertically rotatable, vertically apertured cylinder facing the surface being monitored. U.S. Pat. No. 3,812,419 relates to a static multi-apertured device fixed to the body being monitored. All of these devices are physically quite different from the present invention and in so far as can be determined not adaptable to the present use.

SUMMARY OF THE INVENTION

The present invention solves these and other problems by means of a novel monitoring device which is disposed between two drum surface charging members and which, in conjunction with a feedback circuit loop including computational data processing elements, first establishes a charge level (potential) and then adjusts the potential by sensing the direction of change of potential difference, and thereafter either increments or decrements the surface charge in accordance with the derived feedback signal potential.

The novel sensing probe of the present invention comprises an elongated non-rotatable hollow, cylindrical, tubular shield member provided with a single elongated slot or aperture therein. A segmented charge receiving, rod-like member is rotatably disposed within the shield member and extends from end-to-end thereof. The slot of the shield member is disposed adjacent to, but out of contact with, the rotatable drum of a copy apparatus and extends from edge-to-edge of the drum. One end of the charge receiving member of the probe carries a rotatable disc operably associated with a Hall effect transducer for timing and synchronizing the apparatus. A charge inducing brush member is positioned at each end of the rod member and is in electrical contact with this member.

The sensing probe of the present invention is disposed between two spaced apart electrical charging corotrons. The latter are arranged adjacent to the surface of the copy drum of the copying apparatus. The initial surface charge on the drum is sensed by the probe and compared with a desired known surface potential level. Interconnected data processing apparatus utilizing a predictor algorithm compares the initial surface charge and the known charge level and outputs a control charge level. Through feedback circuitry the output control charge level increments or decrements the drum surface charge to conform the latter to the derived desired charge.

BRIEF DESCRIPTION OF THE DRAWINGS

FIG. 2A is an end view along the line 2A—2A of FIG. 2, partially in section, of the insulating brush holder and shaft support for the apparatus of FIG. 2;

FIG. 2B is a sectional view along the line 2B—2B of FIG. 2 of the fluted center number of the device of FIG. 2;

FIG. 4 is a schematic illustration (not to scale) of the probe shaft position in the "high" and "low" potential position;

FIG. 5 is a schematic illustration (not to scale) of the timing-phasing disc in the "high" and "low" potential position;

FIGS. 6 and 7 are highly schematic illustrations of the capacitor effect between the drum surface and the charge probe of the present invention; and FIG. 8 is an equation demonstrating the high and low charge conditions of the apparatus of FIGS. 6 and 7.

DESCRIPTION OF A PREFERRED EMBODIMENT

In order to assure clean, crisp, clear and legible copy utilizing a photoreceptor drum, it is necessary to place a fixed charge (electrical potential) on the drum surface. The charge must remain and be on the drum surface at the developing station in order to create a usable, i.e., copyable image.

Information (data) is placed on the charge surface through the medium of a switchable laser beam which is caused to scan across the drum from side to side. Single gas lasers are not quickly, easily or efficiently switched on and off as required. A laser diode which is readily switched as desired is therefor employed with the present invention. Characteristically, such diodes generate long wavelength infrared emissions.

The surface charge on the storage drum employed with the present invention which is discharged by the infrared light tends to decay quite rapidly after being charged. This apparently is a property of the infrared sensitive drum surface coating, e.g., Arsenic triselenide doped with tellurium.

It has been determined that the most effective control of the drum surface charge is provided by sensing the charge at the toner-developer station. However, since this is impractical due to obvious physical interference problems, sensing is performed immediately adjacent to the toner-developer station, as will be described subsequently. Also, it is most efficient to sense completely across the drum surface rather than as heretofore sensing only at a specific location or spot area. Thus, the average surface charge for the full width of the drum is sensed by means of the present invention.

The surface charge is placed on the drum by means of high voltage charging corotrons. This charge potential must be on the drum surface at the time the drum has moved to the toner developing station. The corotrons are spaced apart beneath the drum and electrically interconnected to a source of high voltage (power supply).

The drum surface charge sensing probe of the present invention is disposed between the two charging corotrons and immediately adjacent to the corotron closest to the toner developing station. This location, as before mentioned, results solely from space limitations and optical and mechanical interference problems.

Figure 1:
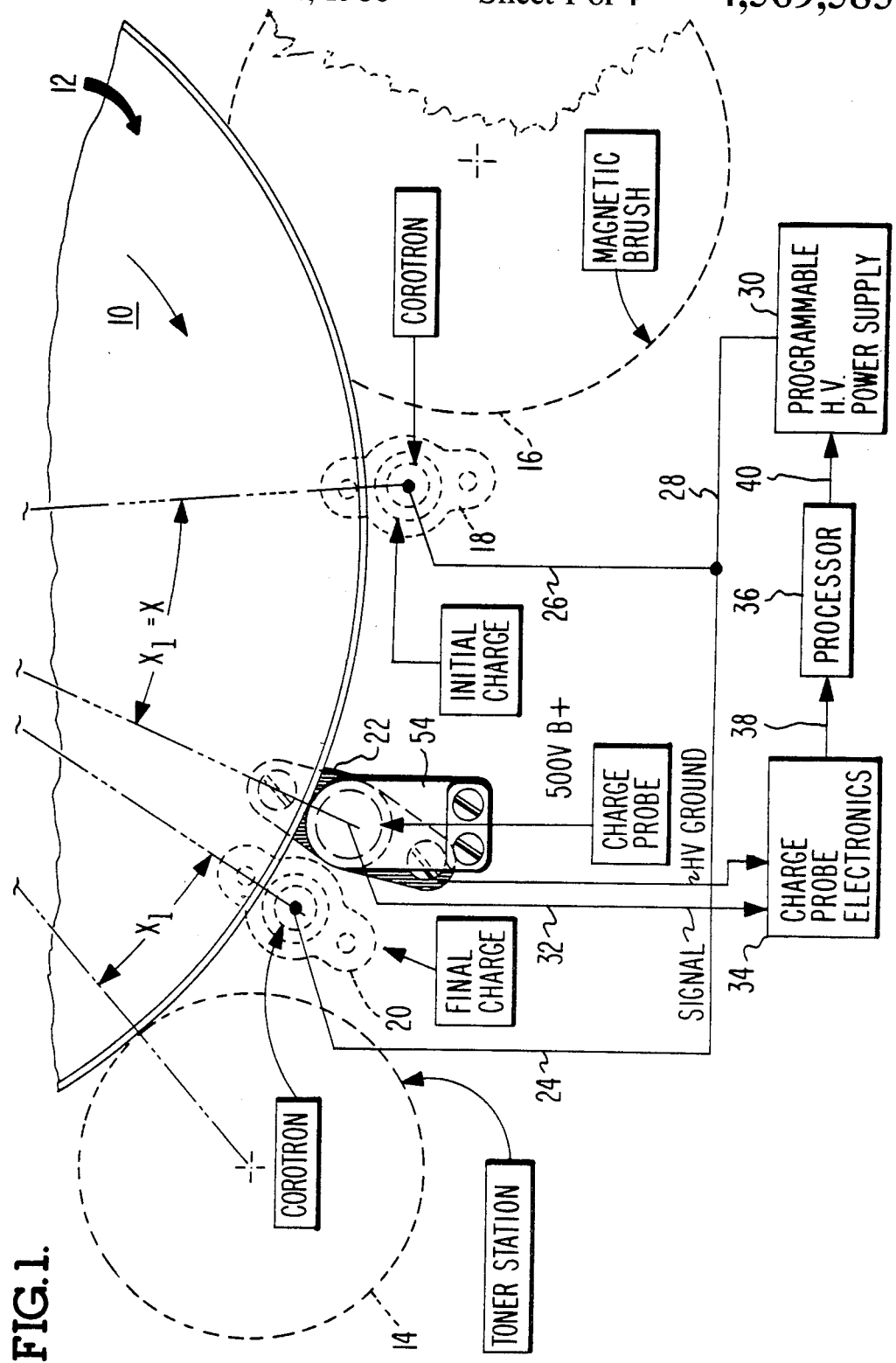
FIG. 1 is a diagrammatic schematic front elevational view of apparatus embodying the present invention including the electronic circuitry utilized therewith.

As seen schematically in FIG. 1, this arrangement includes a photoreceptor drum 10, rotatable about a fixed axis in the direction of arrow 12. Disposed beneath drum 10, intermediate a toner-development station 14 and a rotatable cleaning brush 16 (shown in phantom) are two electrical charging corotrons 18 and 20. A charge probe 22 in accordance with the present invention is located beneath drum 10 and extends across the width of the drum as do the corotrons 18 and 20.

Corotrons 18 and 20 are interconnected over lines 24, 26 and 28 to a programmable high voltage power supply 30. Charge probe 22 is electrically connected over line 32 to charge probe electronics 34, while electronic data processor 36 interconnects charge probe electronics 34 and high voltage power supply 30 over lines 38 and 40, respectively. The "operation" of the electronics will be described later on herein.

Figure 2:
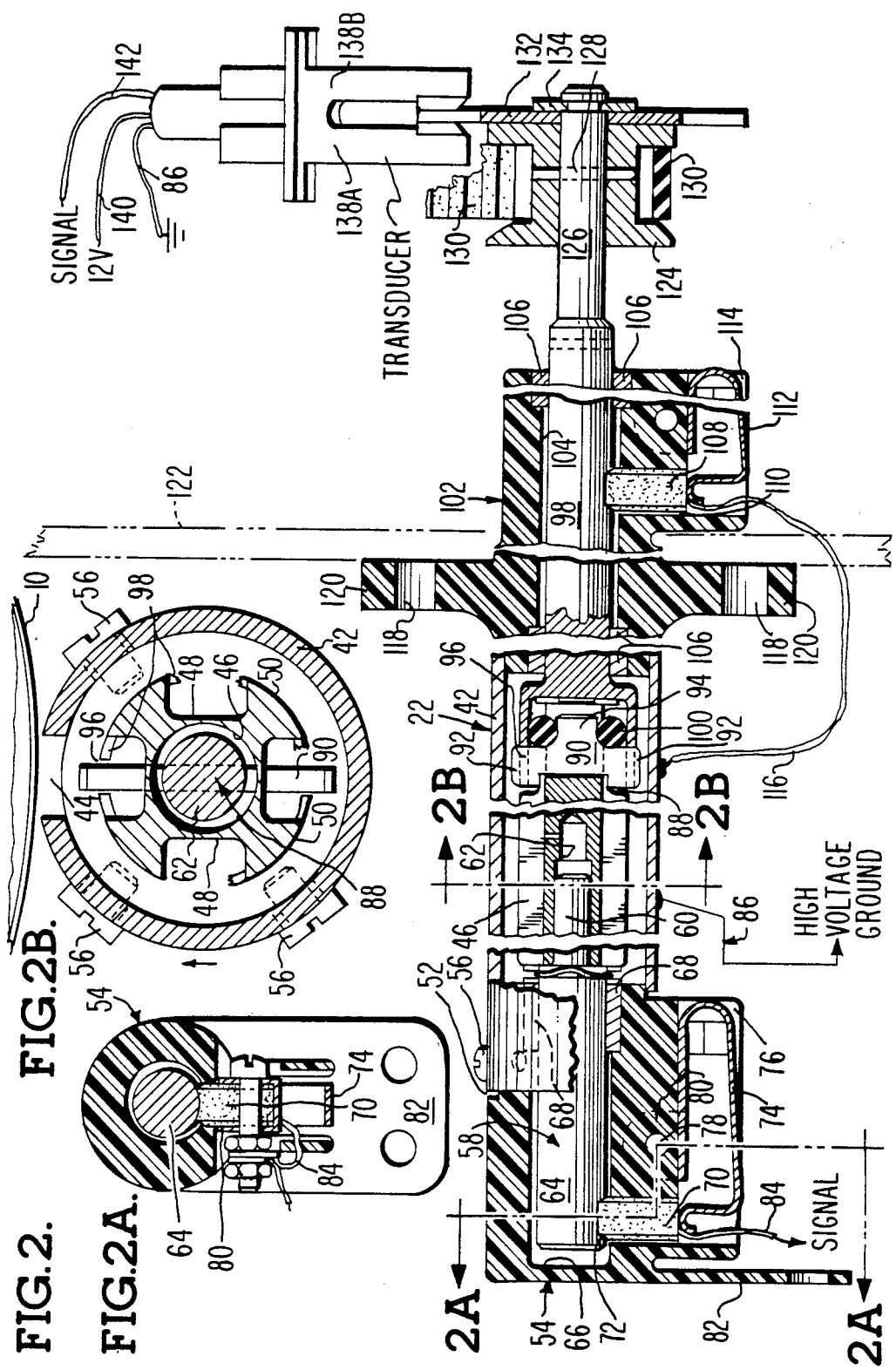
FIG. 2 is a sectional side elevational view of the charge probe embodying the present invention.

The sectional view of FIG. 2 illustrates the improved charge probe sensor assembly 22 of the present invention as a segmented, two piece assembly, certain portions of which are fixed and unmoving, while other separate portions are rotatable relative to the fixed portions. The external portion of assembly 22 comprises a fixed, elongated, cylinder 42 formed as an extrusion from, e.g., aluminum, provided with an integral, elongated opening 44, FIG. 2B, extending from end to end thereof. Cylinder 42 is arranged with its single opening or slot 44 adjacent to and immediately below but slightly spaced from the surface of drum 10, as seen in FIG. 1.

An elongated, segmented, rod-like rigid, solid conductive member 46 extends centrally from end to end within the cylinder member 42. Member 46, as seen in the sectional view of FIG. 2B, is provided with four integral, oppositely disposed flutes or grooves, 48 intermediate respective integral raised lands 50, for purposes to be explained presently herein.

The leftward end of cylinder 42, FIG. 2, is received over and is supported upon an undercut shoulder 52 in lefthand outboard insulator support member 54, positioned and held in place by screws 56. Fluted (shaft) member 46 is supported at the left end by means of a short stub shaft 58. The righthand end 60 of shaft 58 is press fitted within a cylindrical opening 62 in member 46. The enlarged lefthand end 64 of shaft 58 is received within an opening 66 in support 54 and is rotatable on bearing 68. A carbon brush assembly includes brush member 70 disposed within an opening 72 in member 54, and brush flexure spring 74. The flexure 74 is substantially U-shaped and is receivable within an opening 76 within the lower portion of member 54, as shown in FIG. 2. Flexure 74 is, or may be, attached to the member 54 as by a screw, see FIG. 2A, through an opening 78 in the tab 80. Support member 54 is provided with an attachment tang or tab 82 integral with the leftmost end of member 54. An electrical "signal" line 84 is secured to brush member 70 for purposes to be explained later on herein. A high voltage "ground" lead 86 is secured as by screws to outer shell cylinder 42 and fed to charge probe electronics 34 as will also be described shortly.

The rightward end of member 46 is notched as at 88 to receive an electrically insulating key member 90 of general T-shaped outline configuration. The leftward position of key 90 includes oppositely disposed ears 92 which overlap the rightward end of member 46. The oppositely disposed ears 92 leftward end of key 90 are recessed within a slot 96, also FIG. 2B, of the leftward end of input drive shaft 98. An electrically insulating O-ring 100 surrounds the rightward end of key 90 within counterbore 94 (leftward end of input shaft 98). The key 90 together with O-ring 100 electrically insulates the fluted shaft member 46 from the input drive shaft 98 for purposes to be explained shortly.

Drive shaft 98 is supported for rotation within a righthand insulator support member 102 in an opening 104 on oppositely disposed bearing members 106—106 disposed therewithin. A carbon brush 108, similar to brush 70, is received within an opening 110 in member 102 for wiping electrical contact with shaft 98 as shown in FIG. 2. A U-shaped brush holder-flexure spring 112 is disposed within a recess 114 in member 102 and presses brush 108 into contact with shaft 98 for electrical contact therewith. An electrical lead 116 connects brush 108 to the shell/cylinder 42 for purposes to be explained shortly. Holes 118 in oppositely disposed wing members 120 of member 102 permit mounting member 102, for example, through wall structure 122.

An input drive pulley 124 secured to reduced shaft end 126 as by pin 128 is driven from an external source of rotative power (not shown), by means of drive belt 130 so as to rotate shaft 98. Secured for rotation with and attached to pulley 124 (and shafts 98 and 46) is a 4 bladed paddle wheel-like phasing disc member 132 (FIGS. 1 and 5); both, as an assembly, are mounted on the outboard end of shaft end 126 and secured by an E-ring 134 in groove 136 in the shaft end. The timing disc 132 is locked in angle to the rotating fluted member 46 as seen in FIG. 4. A Hall effect transducer 138 is mounted with respect to member 132 such that the U-shaped legs 138A and 138B straddle the paddle wheel 132. Lead 86 connects to H.V. ground. Lead 140 connects to a source of 12 V from a power supply in member 34. Lead 142 is a signal line to the charge probe electronics 34.

The present probe apparatus uses essentially the same electronics as the earlier apparatus U.S. Ser. No. 513,560. The phasing disc 132 indicates to the system electronics the relative position of the fluted probe member 46. The magnetic transducer 138 employed in the present apparatus avoids the toner contamination problem that could interface with an optical type transducer, e.g., block the optical beam going across the rotative path of the rotating member. The Hall effect sensor 139 consists of a horseshoe magnet on one side and a Hall effect sensor on the other side with the phasing disc 132 rotating therebetween. When the metal of the disc passes between the two halves of the Hall sensor, it deflects a magnetic field from the horseshoe magnet around through the metal. When the metal of the phasing disc 132 moves away from between the two legs of the sensor, the field from the magnet can pass through the Hall sensor and back to the magnet.

The signal from the rotating fluted member 46 is picked up by a carbon brush 70 FIG. 2 which rides against the drive shaft 64. This signal together with a signal from the Hall effect sensor over lead 142 is passed into the electronics where it is amplified and delivered to a phase sensitive detector to provide a pulse width modulated output signal.

Referring to FIGS. 6 and 7, it is noted that when the probe apparatus, i.e., the rotatable fluted member 46 is rotated to a position (FIG. 6) such that it is closer to the drum 10, a certain capacitance C (Equation I) is developed therebetween. If there is a potential difference B between these two members, a charge is induced in the capacitor where Q equals CV. When the probe moves to a distal position FIG. 7 relative to the drum 10, a different capacitance $C^1$ is induced in the capacitor $C^1$. The charge of the probe is now $Q = C^1 V$. In both of these cases V is the potential difference between the probe 22 and the surface of the photoconductor—drum 10.

The difference between these two positions results in $Q = (C^1 - C)V$. That is the difference in charge on the probe between these two positions. If moving from the positions of FIG. 6 to that of FIG. 7 occurs in the time interval T, then dividing both halves of the Q equation by T produces a current I. The net result therefore of the rotation of the charge probe is an alternating current I, e.g., probe signal. In other words the current I is proportional to the voltage difference between the photoconductor 10 and the probe 22. The probe is biased electrically at the potential level desired for the drum 10 so that I is zero when the drum is at the current or desired potential level. The potential on the probe was 500 V. The potential on the drum at balance is 500 V. The actual difference between C and $C^1$ is 0.5 pF; (picofarad).

The timing or phasing disc 132 and the Hall effect transducer 138 is used to determine in which particular position the capacitor is located. In this connection a decision must be made, referring to the equation of FIG. 8, as to whether or not this voltage V in the equation relating I to V (whether $C^1 - C$) is negative or V is positive. A signal is provided to the electronics which indicates the C versus the $C^1$ position of the probe. The electronics then looks at the magnitude of I and decides that it is positive or negative. This step produces either a positive or a negative V. A D.C. signal proportional to V (positive or negative) is then sent to power supply 30. The output of supply 30 either increases or decreases the corotron potentials so as automatically to produce the desired potential level on drum 10.

The present apparatus employs significantly fewer and simpler components than the predecessor device U.S. Ser. No. 513,560, enabling the apparatus to be produced much more inexpensively and can be more easily assembled. This improves reliability while measurably reducing cost. In addition, unlike the earlier apparatus, the present mechanism does not utilize or rely on internal electrical connections.

In the subject apparatus the shield member 42, so called, provides two separate functions. One function is to make certain the charge probe "looks" just at the drum. The other function is to make certain that specific parts of the charge probe, i.e., the sensing element, "looks" at a specific portion of the drum that is of interest. In other words if the probe is close to the drum or spaced farther away from the drum, this action helps to define the modulating principle, i.e., in one instant it should appear as a capacitor with plates close together, but at another instant it should appear as a capacitor with plates far apart. Obviously, the information which is sought from the charge probe is how much the voltage on the drum varies from the set point and on which side (plus or minus) of the set point it varies.

The first charge corotron charges the drum as it rotates. This charge immediately decays; so, by the time it reaches the charge probe it is desirable for the charge to be at 500 V. The charge probe must set up the charge on the first charge corotron so that the voltage on the drum at the charge probe is 500 V. The second charge corotron boosts this voltage. The design separation between the two corotrons, the probe and the toner station, are such that when the drum rotates to the toner station, the voltage there is 700 V which is the final desired voltage level potential. Note that the two corotrons are directly connected together. By controlling the voltage at the charge probe to 500 V, the voltage at the toner station of 700 V can also be controlled. Thus the electronics is enabled to compensate for age, use, etc., of the drum.

Figure 3:
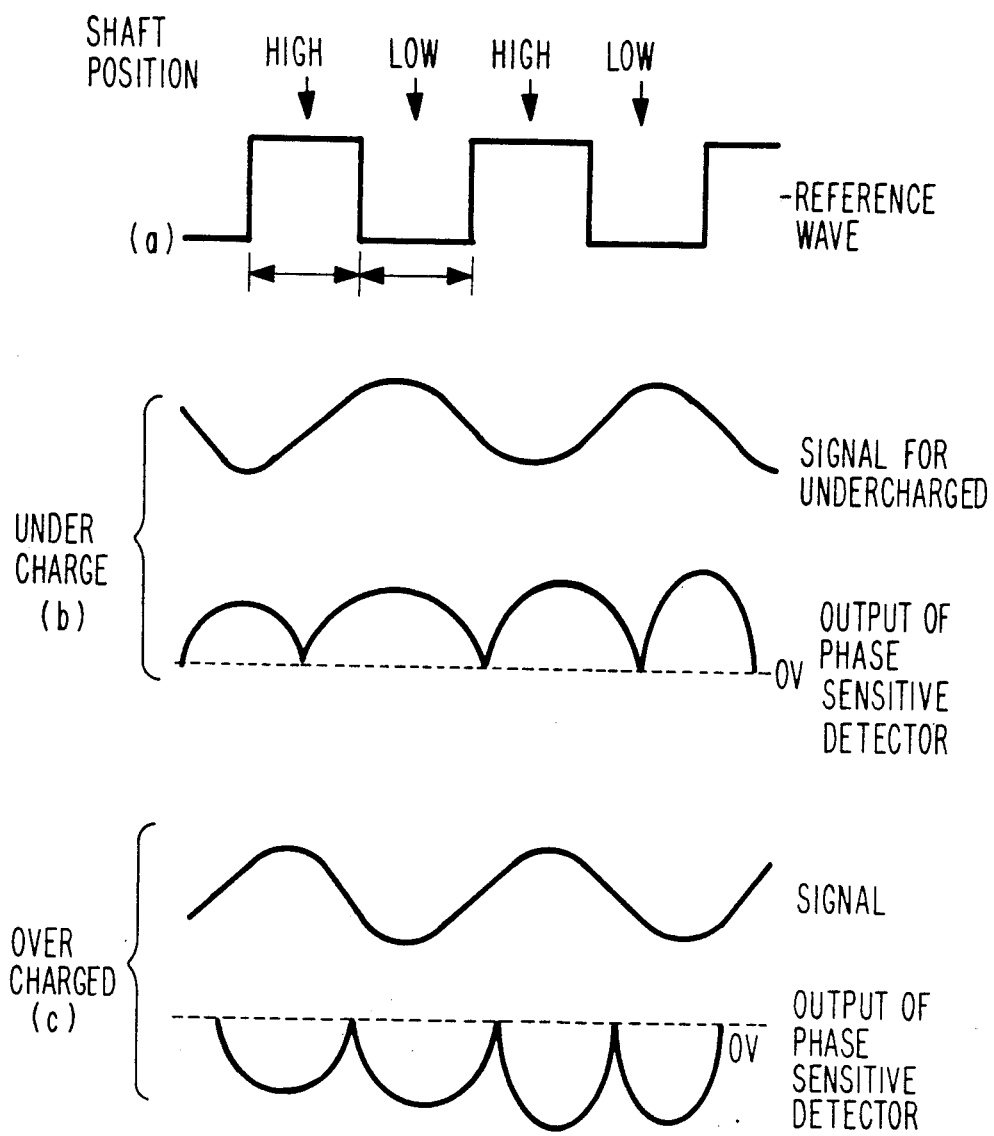
FIGS. 3a-3c inclusive is a series of graphs illustrating the variation in potential of the photoreceptor drum between the undercharge and overcharge condition.

Referring to FIG. 3a, this wave form depicts the reference wave from the Hall effect transducer 138.

As earlier stated herein, as the probe and timing disc rotates, it alternately is close to, then relatively far from the drum. The effect of this action is of an oscillating capacitor. Any voltage difference between the charge probe and the drum develops a charge on this capacitor. As this capacitor oscillates, the charge varies as a sinusoid FIGS. 3b and 3c. When a plate is close to the drum, it is more highly charged. When a plate is away from the drum, it is less highly charged. This charge is provided to the carbon brush 70 riding against the rotating shaft 64. The charge is sensed by the electronics. If the drum is at the same potential level (charge) as the charge probe, then no charge flows back and forth since it acts like a discharged capacitor. This is the null or zero position.

The phase of the sine wave determines whether the drum is overcharged or undercharged. The electronics is provided with two signals. One is the reference wave FIG. 3a from the transducer which indicates whether the two capacitance plates are close together FIG. 6 or far apart FIG. 7. The other signal is from the carbon brush 70.

The two signals are processed, as before mentioned, in a phase sensitive detector (not shown) and together produce a D.C. signal which is either positive or negative. A positive going signal FIG. 3b, corresponds to an undercharged condition on drum 10 whereas a negative going signal FIG. 3c, corresponds to an overcharged condition of drum 10. These two signals are sent to the microprocessor 36 controlling the apparatus and are used to control the power supply. An overcharge on the corotrons is effectively reduced while an undercharge is increased accordingly.

What is claimed is:

1. Electrostatic charge probe sensing apparatus for sensing and controlling the surface charge on a photoreceptor drum comprising,
   an elongated, fluted member,
   cylindrical means surrounding said fluted member,
   electrically insulating means supporting said elongated member and said cylindrical means at opposite ends thereof,
   drive means rotatably coupled to said fluted member,
   electromagnetic phase sensing means coupled to said drive means, and
   means coupled to said fluted member and said drive means for inducing and receiving electrical signals therefrom.

2. The combination according to claim 1 further including means electrically insulating said drive means from said fluted member.

3. The combination according to claim 1 wherein said cylindrical means is provided with an integral slot or aperture extending from end to end thereof.

4. The combinatin according to claim 1 wherein said insulating means supporting said elongated member and said cylindrical means includes means in electrical contact with said fluted member and said drive means for applying electrical potential thereto.

5. The combination according to claim 4 wherein said means in electrical contact comprises a carbon brush.

6. The combination according to claim 1 wherein said fluted member is insulatingly drivingly coupled to said drive means through a dielectric key member intergagging opposite ends of said fluted member and said drive means.

7. The combination according to claim 1 further including bearing means disposed in said electrically insulating and supporting means for rotation of said drive means and said fluted member.

8. The combination according to claim 1 wherein said phase sensing means comprises a Hall effect sensor.

9. The combination according to claim 3 further including a rotatable member carried by the drive means and coupled to the Hall effect sensor and angularly fixed in correspondence to said fluted member for producing an output signal characteristic of the phase relation or position of the fluted member with respect to said aperture.

10. The combination according to claim 1 further including electrical means providing an electrical ground, a low level D.C. input and a signal output for said electromagnetic means.

* * * * *